(12) United States Patent
Butler et al.

(10) Patent No.: US 12,210,294 B2
(45) Date of Patent: Jan. 28, 2025

(54) ACTUATOR ASSEMBLIES COMPRISING PIEZO ACTUATORS OR ELECTROSTRICTIVE ACTUATORS

(71) Applicant: ASML NETHERLANDS B.V., Veldhoven (NL)

(72) Inventors: Hans Butler, Best (NL); Bas Jansen, Den Bosch (NL)

(73) Assignee: ASML NETHERLANDS B.V., Veldhoven (NL)

( * ) Notice: Subject to any disclaimer, the term of this patent is extended or adjusted under 35 U.S.C. 154(b) by 281 days.

(21) Appl. No.: 17/608,760

(22) PCT Filed: May 12, 2020

(86) PCT No.: PCT/EP2020/063178
§ 371 (c)(1),
(2) Date: Nov. 4, 2021

(87) PCT Pub. No.: WO2020/234045
PCT Pub. Date: Nov. 26, 2020

(65) Prior Publication Data
US 2022/0326627 A1 Oct. 13, 2022

(30) Foreign Application Priority Data
May 20, 2019 (EP) .................... 19175397

(51) Int. Cl.
*G03F 7/00* (2006.01)
*H02N 2/02* (2006.01)
*H02N 2/06* (2006.01)

(52) U.S. Cl.
CPC ...... *G03F 7/70758* (2013.01); *G03F 7/70716* (2013.01); *H02N 2/028* (2013.01); *H02N 2/062* (2013.01)

(58) Field of Classification Search
CPC .......... H02N 2/021; H02N 2/02; H02N 2/028; H02N 2/06; H02N 2/062; H02N 2/065; G03F 7/70758
See application file for complete search history.

(56) References Cited

U.S. PATENT DOCUMENTS

| 5,545,962 A | 8/1996 | Wakui |
| 6,020,964 A | 2/2000 | Loopstra et al. |

(Continued)

FOREIGN PATENT DOCUMENTS

| JP | 63209186 A | * | 8/1988 | ............. H02N 2/062 |
| KR | 19980034396 A | * | 8/1998 | |

OTHER PUBLICATIONS

Machine Translation of JP-63209186-A (Year: 1998).*

(Continued)

*Primary Examiner* — Steven H Whitesell
(74) *Attorney, Agent, or Firm* — Pillsbury Winthrop Shaw Pittman, LLP

(57) ABSTRACT

An actuator assembly including a first piezo actuator and a second piezo actuator. The piezo actuator has a correction unit configured to determine an output voltage difference representing a difference between a voltage at the output terminal of the first piezo actuator and a voltage at the output terminal of the second piezo actuator, and a first power correction for correcting the first power signal and/or a second power correction for correcting the second power signal, based on the output voltage difference.

20 Claims, 6 Drawing Sheets

(56) References Cited

U.S. PATENT DOCUMENTS

| | | | |
|---|---|---|---|
| 6,049,407 A | 4/2000 | Melville | |
| 6,952,253 B2 | 10/2005 | Lof et al. | |
| 6,977,461 B2 | 12/2005 | Hendricks et al. | |
| 2005/0127786 A1 | 6/2005 | Hendriks et al. | |
| 2005/0147204 A1* | 7/2005 | Kondo | G03F 7/70841 |
| | | | 378/34 |
| 2007/0058173 A1 | 3/2007 | Holzapfel | |
| 2009/0001851 A1* | 1/2009 | Yoshiyuki | G03F 7/70991 |
| | | | 310/317 |
| 2009/0092929 A1* | 4/2009 | Ota | G02B 7/023 |
| | | | 310/317 |
| 2011/0096423 A1* | 4/2011 | Ashizawa | H10N 30/2023 |
| | | | 310/323.16 |
| 2014/0078487 A1 | 3/2014 | Aubele et al. | |
| 2014/0132113 A1 | 5/2014 | Grohmann et al. | |
| 2014/0312246 A1 | 10/2014 | Takahashi et al. | |
| 2015/0280390 A1* | 10/2015 | Griffin | H01S 3/16 |
| | | | 372/99 |
| 2018/0183357 A1 | 6/2018 | Ouattara et al. | |
| 2018/0224755 A1 | 8/2018 | Butler | |

OTHER PUBLICATIONS

Machine translation of KR-19980034396-A (Year: 1998).*
International Search Report and Written Opinion issued in corresponding PCT Patent Application No. PCT/EP2020/063178, dated Oct. 28, 2020.

* cited by examiner

ACTUATOR ASSEMBLIES COMPRISING PIEZO ACTUATORS OR ELECTROSTRICTIVE ACTUATORS

CROSS-REFERENCE TO RELATED APPLICATION

The application is the U.S. national phase entry of PCT Patent Application No. PCT/EP2020/063178 which was filed May 12, 2020, which claims the benefit of priority of European Patent Application No. 19175397.9 which was filed on May 20, 2019 and which is incorporated herein in its entirety by reference.

FIELD

The present invention relates to electrostrictive actuation. In particular, the invention relates to an actuator assembly comprising at least one or at least two electrostrictive actuators and/or piezo actuators. The invention also relates to an optical system, a stage apparatus, or apparatus comprising such actuator assembly, e.g. a lithographic apparatus, a metrology apparatus, a particle beam apparatus, an electron beam apparatus, an electron beam inspection apparatus, or an inspection apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer). An inspection apparatus is for example suitable for inspecting a pattern which has been applied to an object e.g. to a substrate, e.g. to a wafer.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

To be able to further reduce the dimensions of the circuit elements, performance of all components require improvement. This includes the positioning of various components and objects, which may be done with actuators, e.g. electrostrictive actuators or piezo actuators. For example, piezo actuators may be used to position optical elements. It has also been proposed to position an object table for holding an object, such as a substrate, e.g. a wafer, using piezo actuators.

In general, more than one piezo actuator is required to achieve the desired positioning. Said piezo actuators need to be controlled in correspondence with each other to achieve the desired cooperation between said piezo actuators.

SUMMARY

It is an object of the invention to provide an actuator assembly comprising more than one piezo or electrostrictive actuator, wherein said piezo or electrostrictive actuators are controlled in correspondence with each other, or at least to provide an alternative actuator assembly.

According to a first aspect, this object is achieved with an actuator assembly for moving a load, comprising: a first piezo or electrostrictive actuator having an input terminal configured to receive a first power signal and an output terminal, wherein the first piezo or electrostrictive actuator is configured to expand or contract in a first direction when a voltage difference is present between the input terminal and the output terminal; a second piezo or electrostrictive actuator having an input terminal configured to receive a second power signal and an output terminal, wherein the second piezo or electrostrictive actuator is configured to expand or contract in a second direction when a voltage difference is present between the input terminal and the output terminal, and a correction unit. Said correction unit comprises a first input terminal connected to the output terminal of the first piezo or electrostrictive actuator, and a second input terminal connected to the output terminal of the second piezo or electrostrictive actuator. Said correction unit is configured to determine: an output voltage difference representing a difference between a voltage at the output terminal of the first piezo or electrostrictive actuator and a voltage at the output terminal of the second piezo or electrostrictive actuator, and a first power correction for correcting the first power signal and/or a second power correction for correcting the second power signal, based on the output voltage difference.

According to the first aspect, an output voltage difference is determined. The output voltage difference represents a difference in behaviour between the first piezo or electrostrictive actuator and the second piezo or electrostrictive actuator. If, for example, the voltage at the output terminal of the first piezo or electrostrictive actuator is larger than the voltage at the output terminal of the second piezo or electrostrictive actuator, this may be an indication that the first piezo or electrostrictive actuator has expanded or contracted more, e.g. by a larger distance, than the second piezo or electrostrictive actuator has expanded or contracted. Said difference in expansion and/or contraction, may cause a non-zero resultant force on the load, which may result in vibrations or stress in the load which results in deformation of the load. According to the invention, a first power correction and/or a second power correction is determined for the first power signal and/or the second power signal, respectively, based on the output voltage difference. The first and/or second power correction can be used to improve the control of the first and second piezo or electrostrictive actuators in correspondence with each other, e.g. to reduce vibrations and/or stress and deformations of the load.

In an embodiment the actuator assembly further comprises a power unit, said power unit comprising: a set point terminal configured to receive a set point representative of a desired movement of the load; being configured to generate a first power signal for the first piezo or electrostrictive actuator and second power signal for the second piezo or electrostrictive actuator based on the set point; and being configured to output the first power signal and the second power signal. The power unit is configured to output the first power signal and the second power signal as identical signals, and the correction unit is configured to adjust the first power signal based on the first power correction and/or to adjust the second power signal based on the second power correction.

In this embodiment the first power signal and the second power signal are outputted as identical signals by the power unit, such that the first and second piezo or electrostrictive actuator are configured to contract or expand similarly. However, in practice, e.g. due to manufacturing tolerances, there may still be a difference in the contraction and/or expansion. Therefore, the first and/or second power signal are adjusted by the first and/or second power correction, respectively.

In an embodiment the actuator assembly further comprises a power unit, said power unit comprising: a set point terminal configured to receive a set point representative of a desired movement of the load; comprising a correction terminal configured to receive the first power correction and/or the second power correction from the correction unit; being configured to generate the first power signal for the first piezo or electrostrictive actuator based on the set point and the first power correction, and the second power signal for the second piezo or electrostrictive actuator based on the set point and the second power correction, and being configured to output the first power signal and the second power signal. In this embodiment advantageously the first and second power signal are generated taking into account the first and second power correction, respectively.

In an embodiment the actuator assembly further comprises a feedback unit, said feedback unit comprising a first input terminal connected to the output terminal of the first piezo or electrostrictive actuator, and a second input terminal connected to the output terminal of the second piezo or electrostrictive actuator. The feedback unit is configured to determine a common output voltage representing a correspondence between the voltage at the output terminal of the first piezo or electrostrictive actuator and the voltage at the output terminal of the second piezo or electrostrictive actuator, and determine a feedback value representative of a movement of the load, based on the common output voltage. Advantageously the common output voltage may be representative for a common force exerted on the load, and therefore also for the movement of the load. A feedback value can be determined, which can e.g. be used to compare the movement of the load with a set point for a desired movement of the load. It is noted that in an embodiment the invention may also result to an actuator assembly comprising the feedback unit but not the correction unit.

According to a second aspect, the object of the invention is achieved with an actuator assembly for moving a load, comprising: a first piezo or electrostrictive actuator having a first terminal and a second terminal, wherein the first piezo or electrostrictive actuator is configured to expand in a first direction when a voltage at the first terminal is larger than a voltage at the second terminal; a second piezo or electrostrictive actuator having a first terminal and a second terminal, wherein the second piezo or electrostrictive actuator is configured to expand in a second direction when a voltage at the first terminal is larger than a voltage at the second terminal; and a power unit. Said power unit comprises a set point terminal configured to receive a set point representative of a desired movement of the load. Said power unit is configured to generate a power signal for the first and second piezo or electrostrictive actuator based on the set point. Preferably, the power unit is configured to provide the power signal to the first terminal of the first piezo or electrostrictive actuator and to the second terminal of the second piezo or electrostrictive actuator.

In this embodiment, the power unit outputs a single power signal for controlling the first and second piezo or electrostrictive actuator. Advantageously the first and second piezo or electrostrictive actuator may contract and/or expand similarly, even substantially identical. In addition, it is preferred that the power signal is provided to the first terminal of the first piezo or electrostrictive actuator and to the second terminal of the second piezo or electrostrictive actuator. When the first piezo or electrostrictive actuator expands, the second piezo or electrostrictive actuator will contract, and vice versa, by substantially the same distance.

In an embodiment of the actuator assembly according to the first aspect and/or the second aspect, the first direction and the second direction are substantially parallel, and optionally coinciding. Advantageously the first and second piezo or electrostrictive actuator cooperate to move the load in the same direction, being both the first and second direction.

In an embodiment of the actuator assembly according to the first aspect and/or the second aspect, the first piezo or electrostrictive actuator and the second piezo or electrostrictive actuator are configured to move the load in the first direction and/or in the second direction. So, the load is moved in the same direction as the first and/or second piezo or electrostrictive actuator expands or contracts. Advantageously, the invention allows to control the first and second piezo or electrostrictive actuator in correspondence with each other to improve the movement of the load, e.g. decreasing vibrations, stress and deformation.

In a further embodiment, the actuator assembly further comprises a third piezo or electrostrictive actuator configured to move the load in a perpendicular direction, said perpendicular direction being perpendicular to the first direction and the second direction, wherein the third piezo or electrostrictive actuator has a clamped mode configured to clamp the load, and a released mode configured to allow the load to move relative to the third actuator in the first and second direction. Advantageously the load can also be moved in the perpendicular direction, while during movement in the first and second direction the load is only little or even not at all affected by the third piezo or electrostrictive actuator when in the released state. In an embodiment the first and second direction are substantially parallel in a substantially horizontal plane, and the third direction is also in the substantially horizontal plane. In an embodiment the first and second direction are in a substantially in a horizontal plane and the third direction is in a substantially vertical plane.

In an embodiment of the actuator assembly according to the first aspect and/or the second aspect, the first piezo or electrostrictive actuator and the second piezo or electrostrictive actuator each have a clamped mode configured to clamp the load, and a released mode configured to allow the load to move relative to the first or second piezo or electrostrictive actuator, respectively. The first piezo or electrostrictive actuator is configured to be arranged from the clamped mode into the released mode by expanding or contracting in the first direction, and the second piezo or electrostrictive actuator is configured to be arranged from the clamped mode into the released mode by expanding or contracting in the second direction. Advantageously the invention allows to control the first and second piezo or electrostrictive actuator in correspondence with each other, such that e.g. vibration, stress and deformation of the load can be reduced when moving from the clamped mode to the released mode and vice versa.

In a further embodiment the actuator assembly further comprises a first perpendicular actuator configured to move the load in a third direction substantially perpendicular to the first direction, wherein the first piezo or electrostrictive actuator is configured to arrange the first perpendicular actuator such that the first perpendicular actuator is able to move the load, when the first piezo or electrostrictive actuator is in the clamped mode. The actuator assembly further comprises a second perpendicular actuator configured to move the load in a fourth direction substantially perpendicular to the second direction, wherein the second piezo or electrostrictive actuator is configured to arrange the second perpendicular actuator such that the second perpendicular actuator is able to move the load, when the second piezo or electrostrictive actuator is in the clamped mode.

In a further embodiment, the first perpendicular actuator is a third piezo or electrostrictive actuator and the second perpendicular actuator is a fourth piezo or electrostrictive actuator. Optionally the third and fourth piezo or electrostrictive actuator are shear piezo or electrostrictive actuators. Optionally the third and fourth piezo or electrostrictive actuator are embodied in accordance with the first and/or second aspect.

The invention further relates to a stage apparatus comprising an object holder configured to hold an object, and an actuator assembly according to the first aspect and/or the second aspect, configured to move the object holder.

In accordance with the second aspect, the invention further relates to a stage apparatus comprising an object holder configured to hold an object, and an actuator assembly configured to move the object holder in a first direction and/or a second direction. The actuator assembly comprises: a first piezo or electrostrictive actuator having a first terminal and a second terminal, wherein the first piezo or electrostrictive actuator is configured to expand in the first direction when a voltage at the first terminal is larger than a voltage at the second terminal; a second piezo or electrostrictive actuator having a first terminal and a second terminal, wherein the second piezo or electrostrictive actuator is configured to expand in the second direction when a voltage at the first terminal is larger than a voltage at the second terminal; and a power unit configured to output a power signal based on a control signal, wherein the power unit is configured to provide the power signal to the first terminal of the first piezo or electrostrictive actuator and to the second terminal of the second piezo or electrostrictive actuator.

According to a third aspect, the invention relates to a stage apparatus comprising an object holder configured to hold an object, and a positioner comprising a first positioning module and a second positioning module. The first positioning module comprises at least a first piezo or electrostrictive actuator configured to position the object holder, and the second positioning module is configured to position the object holder and the first positioning module based on an object holder set point representing a desired movement of the object holder during positioning with the second positioning module. The stage apparatus further comprises a processing unit configured to determine a corrected object holder set point based on relative displacement between the second positioning module and the object holder caused by a deformation of the first positioning module during positioning with the second positioning module.

The first positioning module may e.g. be used to position the second positioning module and the object holder over a relatively large distance, while the second positioning module may be used to position the object holder over a relatively small distance with relatively high accuracy. During positioning with the first positioning module, the first piezo or electrostrictive actuator may extent or contract with a degree depending on the stiffness. Since the first piezo or electrostrictive actuator is arranged between the first positioning module and the object holder, this will cause a relative displacement between the second positioning module and the object holder. The actual movement of object holder may therefore differ from the object holder set point. In order to be able to take account of this, the processing unit is configured to determine the corrected object holder set point.

In an embodiment, the corrected object holder set point represents a correction for the object holder set point, wherein the second positioner is configured to position the object holder and the first positioning module based on the corrected object holder set point. Advantageously the relative displacement between the first positioning module and the object holder is compensated for.

In an embodiment, the corrected object holder set point represents a correction for the movement of the object holder during positioning with the second positioning module. Advantageously the relative displacement between the first positioning module and the object holder is taken into account.

In an embodiment, the corrected object holder set point is based on at least a stiffness of at least the first piezo or electrostrictive actuator.

The invention further relates to an apparatus comprising an actuator assembly according to the invention and/or a stage apparatus according to the invention. The apparatus may e.g. be a lithographic apparatus, a metrology apparatus, a particle beam apparatus, an electron beam apparatus, an electron beam inspection apparatus, or an inspection apparatus.

The invention further relates to a projection system for use in a lithographic apparatus or an inspection apparatus, comprising one or more optical elements, and an actuator assembly according to the invention, configured to move at least one of the one or more optical elements.

The invention further relates to a device manufacturing method comprising transferring a pattern from a patterning device onto a substrate, comprising the step of using a lithographic apparatus comprising: an actuator assembly according to the invention; and/or a stage apparatus according to the invention; and/or a projection system according to the invention.

BRIEF DESCRIPTION OF THE DRAWINGS

Embodiments of the invention will now be described, by way of example only, with reference to the accompanying schematic drawings, in which the same reference numbers indicate the same or similar features. In the drawings.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
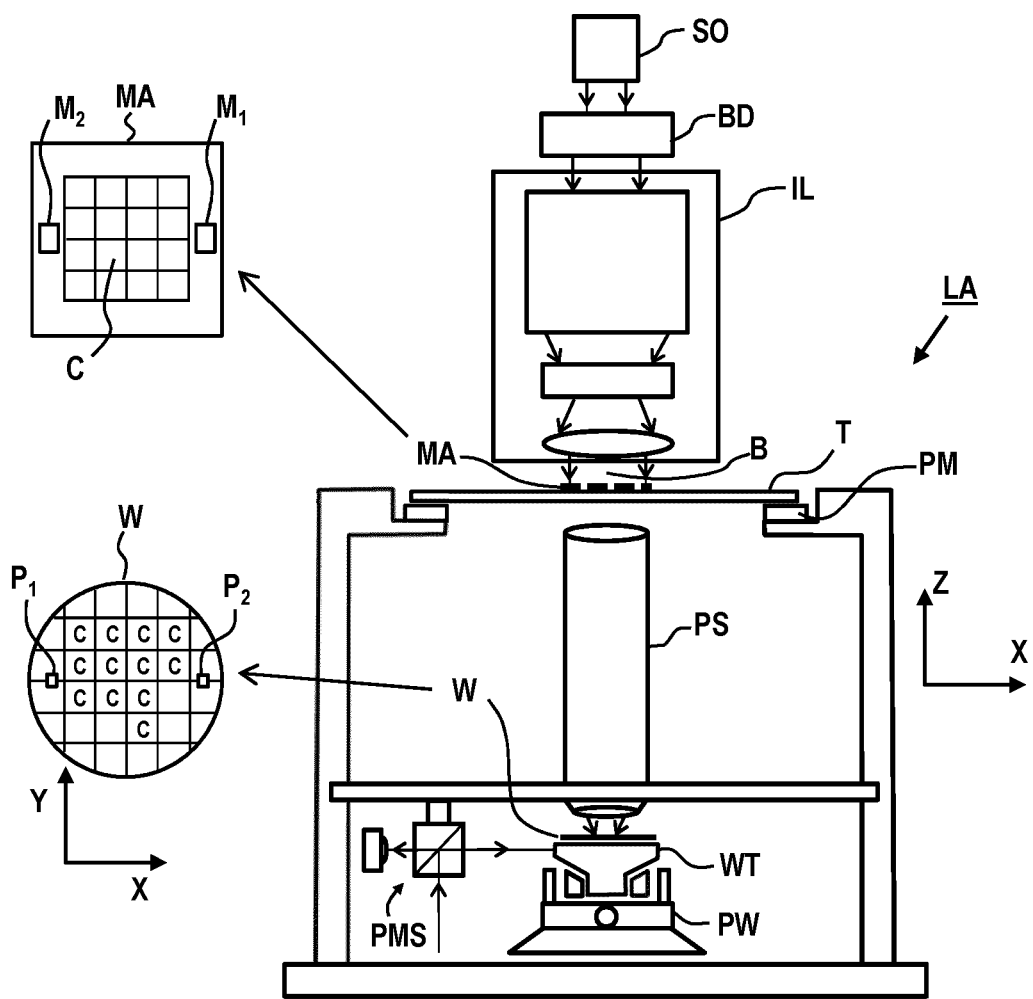
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
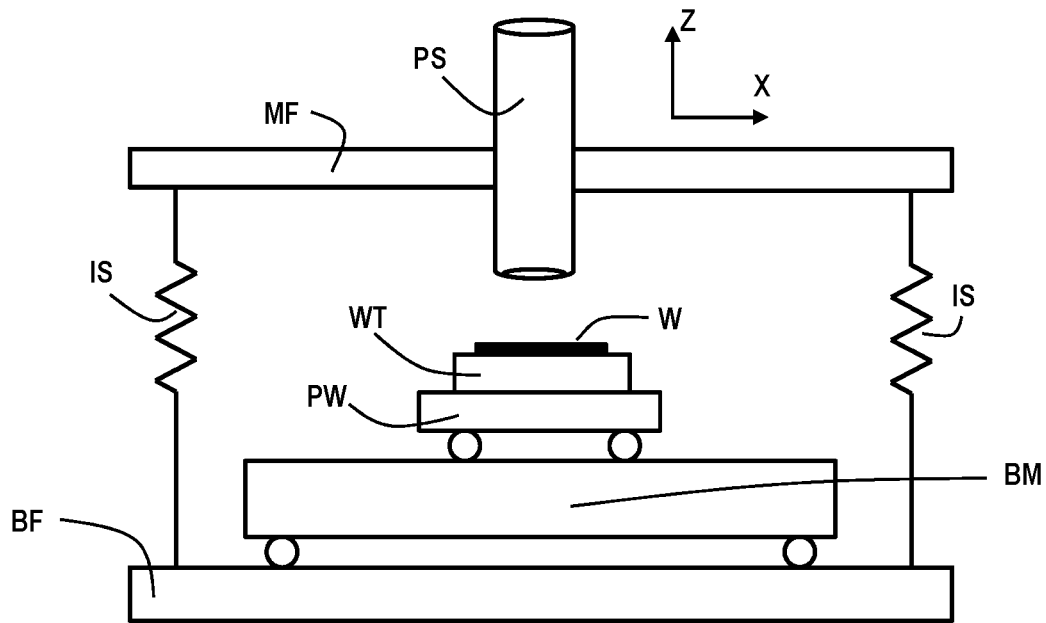
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference.

The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
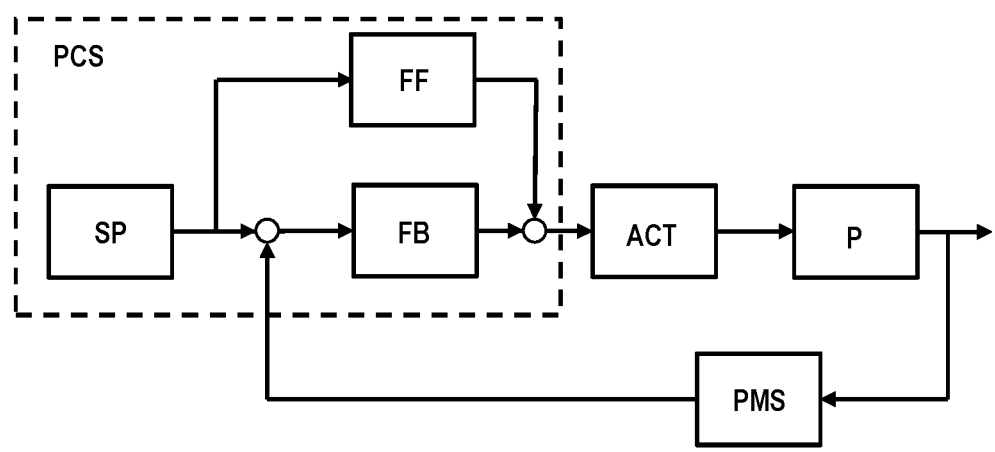
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

A topography measurement system, level sensor or height sensor, and which may be integrated in the lithographic apparatus, is arranged to measure a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Various components in the lithographic apparatus and related apparatus need to be moved by an actuator assembly. An actuator assembly may comprise a piezo actuator or electrostrictive actuator. A first example is schematically shown in a top view in FIG. 4a, wherein a load 14 is moved relative to a frame 13 by an actuator assembly. FIG. 4b schematically illustrates the example from a side view. The actuator assembly comprises a first piezo actuator 11 and a second piezo actuator 12 configured to move the load in direction x. The actuator assembly comprises a third piezo actuator 15 and a fourth piezo actuator 16 configured to move the load 14 in direction y. For moving the load in the +x direction, the first piezo actuator 11 will expand and the second piezo actuator 12 will contract. If the first piezo actuator 11 expands more than the second piezo actuator 12 contracts, the load 14 will be subjected to a non-zero resultant force, which may cause stress in the load 14 and thus deformation of the load 14. It is therefore desired that the first 11 and second piezo actuator 12 are controlled in correspondence with each other.

For example, the load 14 may be substrate support WT shown in FIGS. 1-2, and the actuator assembly may be part of the second positioner WP. For example, the load 14 may be the mask support MT shown in FIGS. 1-2, and the actuator assembly may be part of the first positioner PM.

Figure 5:
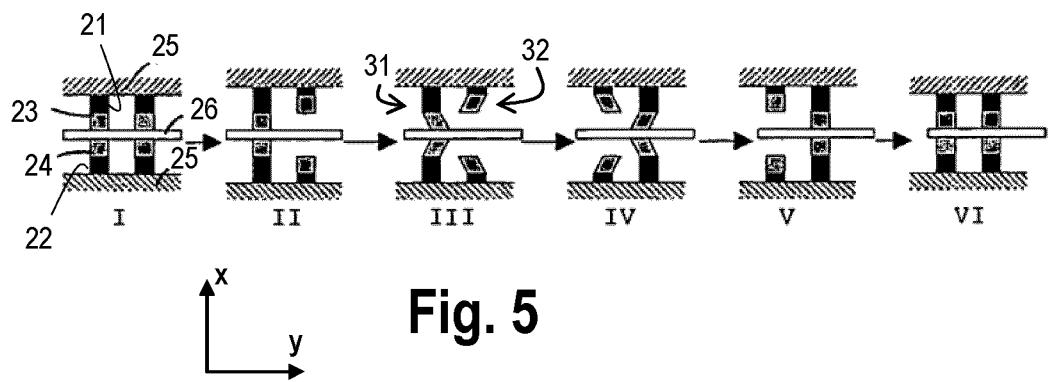
FIG. 5 schematically illustrate another application of an actuator assembly comprising a piezo actuator.

Another example of an actuator assembly comprising a piezo actuator is illustrated in FIG. 5, which shows six stages I-VI to illustrate the working principle. In the shown example, a first piezo actuator 21 and a second piezo actuator 22 can be moved between a clamped mode, as is e.g. shown stage I, II, III and VI, and a released mode, as is e.g. shown in stage IV and V. The first piezo actuator 21 and second piezo actuator 22 can be moved from the clamped mode to the released mode by extending in direction y and vice versa by contracting. A third piezo actuator 23 is provided at an end of the first piezo actuator 21 and a fourth piezo actuator 24 is provided at an end of the second piezo actuator 22. The third 23 and fourth piezo actuator 24 are shear-piezo actuators, configured to move a load 26 in a direction x, which is perpendicular to direction y. The actuator assembly comprises multiple sets 31,32 comprising a plurality of piezo actuators such as the first 21, second 22, third 23 and fourth piezo actuator 24. As such, the load 26 can be moved in direction y by a first set 31 of the multiple sets while a second set 32 of the multiple sets has its respective first and second piezo actuator in the released mode. The actuator assembly allows to pass the load 26 over a relatively large distance in direction y. However, if the first 21 and second 22 piezo actuator and/or the third 23 and fourth piezo actuator 24, respectively, exert a different force on the load 26, the load 26 might start vibrating or deforming. It is also possible that internal stresses lead to increased abrasive wear of the contact surfaces of the actuator assembly and/or the load 26, which decreases the overall lifetime of the actuator assembly. It is therefore desired that the first 21 and second piezo actuator 22, and the third 23 and fourth piezo actuator 24 are controlled in correspondence with each other.

The actuator assembly shown in FIG. 5 may e.g. be used to move an optical element, such as a lens or mirror, in a lithographic apparatus, for example in the illumination system IL shown in FIG. 1. More details and examples of similar actuator assemblies are provided in U.S. Pat. No. 6,977,461 B2, which is incorporated herein by reference.

It is an object of the invention to provide an actuator assembly comprising more than one piezo actuator, wherein said piezo actuators are controlled in correspondence with each other, or at least to provide an alternative actuator assembly.

Figure 6:
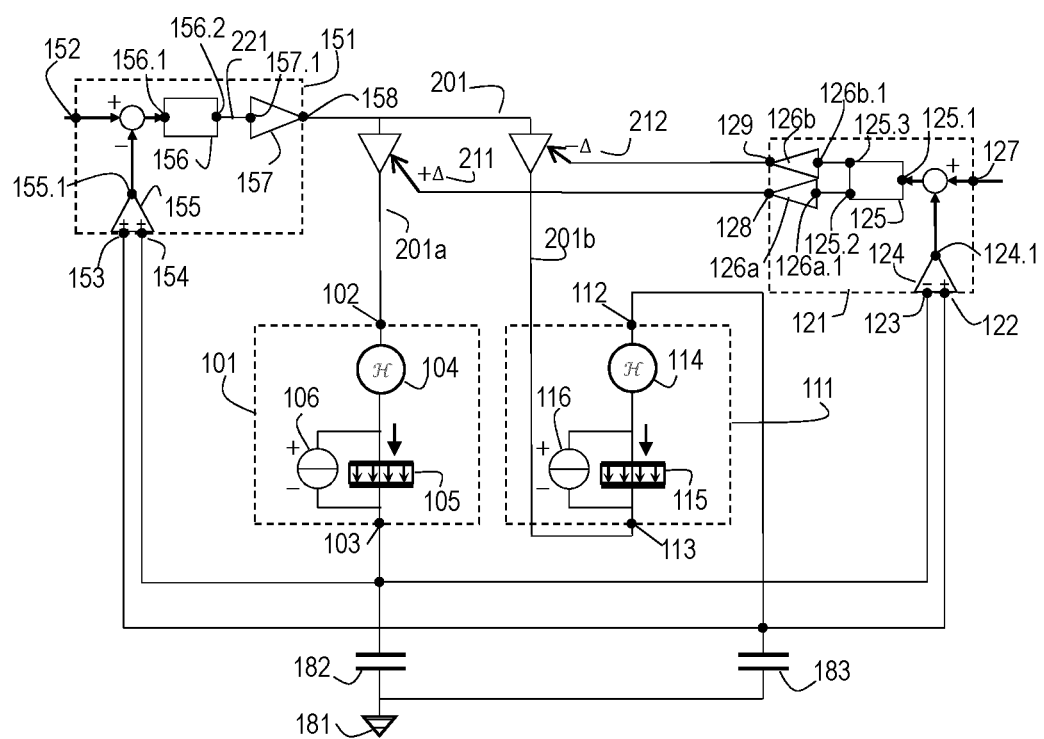
FIG. 6 schematically illustrates an embodiment of the invention.
Figure 7:
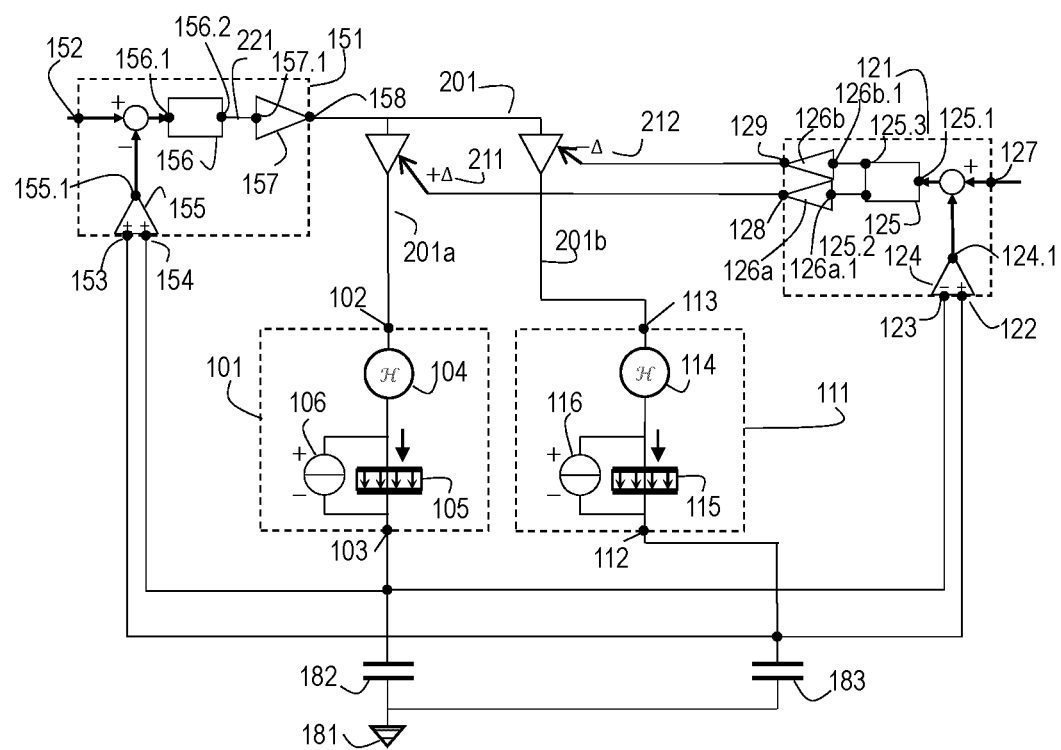
FIG. 7 schematically illustrates another embodiment of the invention.

FIG. 6 and FIG. 7 schematically illustrate an embodiment of the invention. According to a first aspect, the invention relates to an actuator assembly for moving a load, comprising a first piezo actuator 101 having an input terminal 102 configured to receive a first power signal 201a and an output terminal 103, wherein the first piezo actuator 101 is configured to expand or contract in a first direction when a voltage difference is present between the input terminal 102 and the output terminal 103. The actuator assembly further comprises a second piezo actuator 111 having an input terminal 113 configured to receive a second power signal 201b and an output terminal 112, wherein the second piezo actuator 111 is configured to expand or contract in a second direction when a voltage difference is present between the input terminal 113 and the output terminal 112. The actuator assembly further comprises a correction unit 121 comprising a first input terminal 123 connected to the output terminal 103 of the first piezo actuator 101, and a second input terminal 122 connected to the output terminal 112 of the second piezo actuator 111. Said correction unit 121 is configured to determine: an output voltage difference representing a difference between a voltage at the output terminal 103 of the first piezo actuator 101 and a voltage at the output terminal 112 of the second piezo actuator 111, and a first power correction 211 for correcting the first power signal 201a and/or a second power correction 212 for correcting the second power signal 201b, based on the output voltage difference.

It is noted that the invention will further be explained with reference to piezo actuators. The skilled person will understand, however, that the one or more of the piezo actuators may be replaced by electrostrictive actuators without deriving from the scope of the invention. The first and second electrostrictive actuator may be any suitable electrostrictive actuator, e.g. comprising PMP-PT material. The first and second electrostrictive actuator may in an embodiment be voltage driven. Any other actuator comprised by the actuator assembly may be embodied similarly to any of the embodiments described with respect with the first and second electrostrictive actuator.

The first 101 and second piezo actuator 111 may be any suitable piezo actuator, e.g. voltage driven, charge driven or current driven. The first 101 and/or second piezo actuator 111 may e.g. comprises PZT or LiNbO$_3$ material. Optionally the first 101 and second piezo actuator 111 are voltage driven when comprising LiNbO$_3$ material, which is highly linear. Optionally the first 101 and second piezo actuator 111 are charge driven when comprising PZT material. In the figures the first 101 and second piezo actuator 111 are shown schematically. A hysteresis component 104, 114 represents a non-linear relation between the expansion or contraction of the piezo actuator 101, 111 and the voltage difference between the respective input terminal 102, 113 and output terminal 103, 112. A force induced component 106,116 represents an extra charge on the piezo actuator 101, 111 introduced by a force to which the piezo actuator 101, 111 is subjected, e.g. due to movement of the load. Any other actuator may be embodied similarly to any of the embodiments described with respect with the first 101 and second piezo actuator 111. In the shown example, the actuator assembly further comprises a first reference capacitor 182 between the first piezo actuator 101 and a ground 181, and a second reference capacitor 183 between the second piezo actuator 111 and the ground 181.

The first 101 and second piezo actuator 111 are configured to expand or contract, based on a voltage difference between their respective input terminal 102, 113 and output terminal 103, 112. Using said expansion and/or contraction, a load can be moved, either directly or indirectly. For example, the load can be moved in the first and/or second direction, e.g. as in the example shown in FIG. 4a, or the load can be moved in a direction perpendicular to the first and/or second direction, e.g. as in the example shown in FIG. 5. The magnitude of expansion and/or contraction of the first 101 and second piezo actuator 111 is dependent on, among others, the power signal 201a, 201b provided to the respective input terminal 102, 113. The power signal 201a, 201b may represent a voltage, current or charge, dependent on the type of piezo actuator used. The voltage at the output terminals 103, 112 of the first 101 and second piezo actuator 111 is dependent on, among other, the respective power signal 201a, 201b and expansion or contraction.

According to the first aspect, an output voltage difference is determined. The output voltage difference represents a difference in behaviour between the first piezo actuator 101 and the second piezo actuator 111. If, for example, the voltage at the output terminal 103 of the first piezo actuator 101 is larger than the voltage at the output terminal 112 of the second piezo actuator 111, this may be an indication that the first piezo actuator 101 has expanded or contracted more, e.g. by a larger distance, than the second piezo actuator 111 has expanded or contracted. Said difference in expansion and/or contraction, may cause a non-zero resultant force on the load, which may result in vibrations or deformation of the load. In addition, the force induced components 106,116 may contribute to the voltage at the respective output terminal 103, 112 differently if the first 101 and second piezo actuator 111 are subjected to a different reaction force during movement of the load, which may indicate a non-zero resultant force on the load. According to the invention, a first power correction 211 and/or a second power correction 212 is determined for the first power signal 201a and/or the second power signal 201b, respectively, based on the output voltage difference. The first 211 and/or second power correction 212 can be used to improve the control of the first 101 and second piezo actuator 111 in correspondence with each other, e.g. to reduce vibrations and/or deformations of the load.

In an embodiment the actuator assembly further comprises a power unit 151, said power unit 151 comprising: a set point terminal 152 configured to receive a set point representative of a desired movement of the load; being configured to generate a first power signal 201a for the first piezo actuator 101 and second power signal 201b for the second piezo actuator 111 based on the set point; and being configured to output the first power signal 201a and the second power signal 201b. The power unit 151 is configured to output the first power signal 201a and the second power signal 201b as identical signals, and the correction unit 121 is configured to adjust the first power signal 201a based on the first power correction 211 and/or to adjust the second power signal 201b based on the second power correction 212.

The desired movement of the load, as represented by the set point, may include a desired position, end position, speed and/or acceleration of the load. The power unit 151 may e.g. comprise a processing unit 156 configured to determine the first 201a and second power signal 201b based on the set point. The power unit 152 may e.g. comprises an amplifier circuit 157 configured to amplify a control signal 221 outputted by the processing unit 156, such that it is converted into a power signal 201. The amplifier circuit 157 may comprise a single amplifier or more than one amplifier. The first power signal 201a and the second power signal 201b are outputted as identical signals by the power unit 151. In the shown example, this is achieved by the power unit 151 outputting a single power signal 201 which is split into the first power signal 201a and the second power signal 201b, but other arrangements are possible. For example, the power unit 151 may output the first 201a and second power signal 201*b* as separate signal which are identical to each other. For example, optionally the processing unit 156 outputs two signals which are converted into the first 201*a* and second power signal 201*b*, respectively, by one or more amplifier circuits 157.

Since the first 201*a* and second power signal 201*b* are configured to be identical, the first 101 and second piezo actuator 111 are configured to contract or expand similarly. However, in practice, e.g. due to manufacturing tolerances, there may still be a difference in the contraction and/or expansion. This may e.g. be because the first 101 and second piezo actuator 111 do not behave exactly identical. Another cause may be that the first 201*a* and second power signal 201*b* are not identical, e.g. because of components in the circuit or external influences such as electrical or magnetic fields. The difference in expansion and/or contraction between the first 101 and second piezo actuator 111 is at least partly detected by the correction unit 121 in the output voltage difference. In the shown example, the correction unit 121 comprises a processing unit 125 for determining the first 211 and/or second 212 power correction, and two amplifier circuits 126*a*, 126*b* for converting a signal outputted by the processing unit 125 into a power signal. The first 201*a* and/or second power signal 201*b* are adjusted by the first 211 and/or second power correction 212, respectively.

The difference between FIG. 6 and FIG. 7 is which terminal of the second piezo actuator 111 is used as input terminal and which terminal is used as output terminal. In the arrangement shown in FIG. 6, the second piezo actuator 111 is connected inversely relative to the first piezo actuator 101. A power signal 201 causing the first piezo actuator 101 to expand will therefore cause the second piezo actuator 111 to contract. This arrangement can e.g. be used in for the actuator assembly shown in FIG. 4*a*-4*b*. In the arrangement shown in FIG. 7, the second piezo actuator 111 is connected similar to the first piezo actuator 101. A power signal 201 causing the first piezo actuator 101 to expand will therefore cause the second piezo actuator 111 to also expand. This arrangement can e.g. be used in for the actuator assembly shown in FIG. 5.

Figure 8:
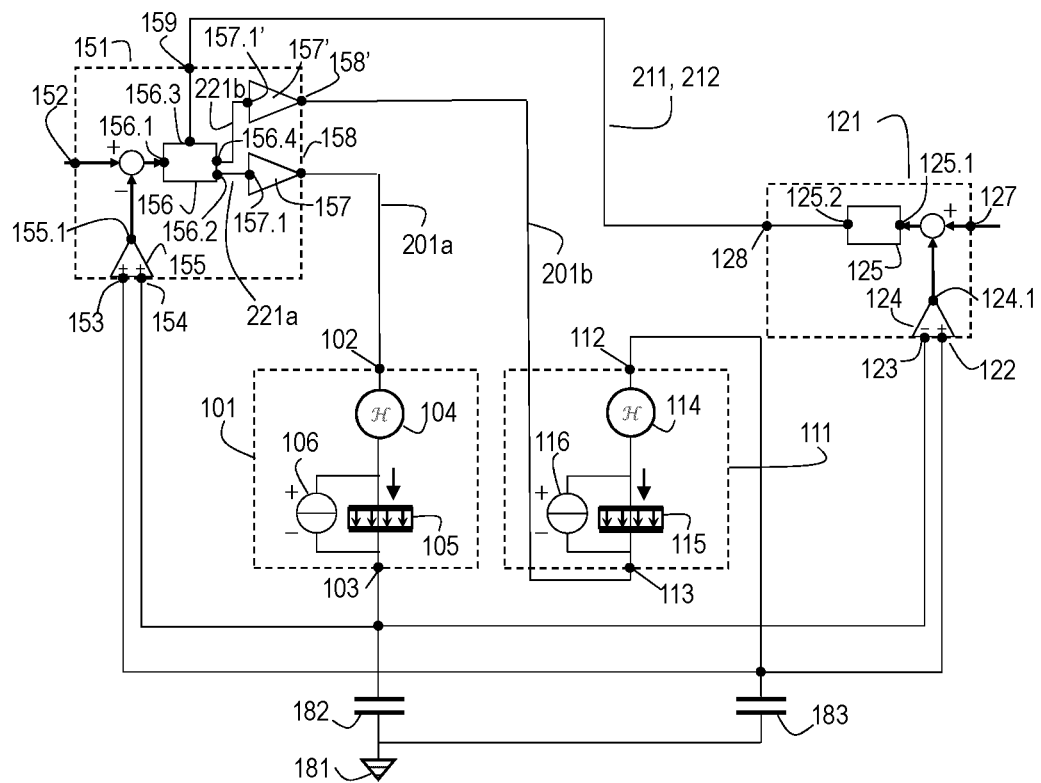
FIG. 8 schematically illustrates yet another embodiment of the invention.

FIG. 8 shows yet another embodiment according to the invention. In this embodiment, the actuator assembly further comprises a power unit 151, said power unit 151 comprising: a set point terminal 152 configured to receive a set point representative of a desired movement of the load; comprising a correction terminal 159 configured to receive the first power correction 211 and/or the second power correction 212 from the correction unit 121; being configured to generate the first power signal 201*a* for the first piezo actuator 101 based on the set point and the first power correction 211, and the second power signal 201*b* for the second piezo actuator 111 based on the set point and the second power correction 212, and being configured to output the first power signal 201*a* and the second power signal 201*b*.

In this embodiment, advantageously the first power signal 201*a* and second power signal 201*b* are generated taking into account the first and second power correction 212, respectively, as well as the set point. In the shown example, the processing unit 156 is configured to output a first control signal 221*a* which is converted into the first power signal 201*a* by amplifier circuit 157 and outputted via output terminal 158. The processing unit 156 is also configured to output a second control signal 221*b* which is converted into the second power signal 201*b* by a further amplifier circuit 157' and outputted via a further output terminal 158'. It is noted that although in FIG. 8 the correction unit 121 and power unit 151 are shown separately, in practice it may be possible to incorporate the correction unit 121 into the power unit 151, wherein optionally the processing unit 156 determines the first 201 and/or second power correction 211.

As can be seen in FIG. 6, FIG. 7 and FIG. 8, in an embodiment the actuator assembly further comprises a feedback unit 155. Said feedback unit 155 comprises a first input terminal 154 connected to the output terminal 103 of the first piezo actuator 101, and a second input terminal 153 connected to the output terminal 112 of the second piezo actuator 111. The feedback unit 155 is configured to determine a common output voltage representing a correspondence between the voltage at the output terminal 103 of the first piezo actuator 101 and the voltage at the output terminal 112 of the second piezo actuator 111, and determine a feedback value representative of a movement of the load, based on the common output voltage.

As explained above, the voltage at the output terminal 103, 112 of the first 101 and the second piezo actuator 111 is dependent on the respective expansion or contraction. The common output voltage may therefore be representative of a correspondence between expansion and/or contraction of the first 101 and second piezo actuator 111. The common output voltage may therefore be representative for a common force exerted on the load, and therefore also for the movement of load. From the common output voltage, a feedback value can be determined, which is representative of the actual movement of the load. The feedback value can e.g. be used to compare the movement of the load with a set point for a desired movement of the load.

In the shown example, the feedback unit 155 is comprised by the power unit 151. In the shown example, the feedback value is detracted from the set point. Alternatively, the feedback value may be determined by the processing unit 156, wherein the processing unit 156 determines the first 201*a* and/or second power signal 201*b* based on the feedback value and the set point.

FIG. 6 and FIG. 8 further illustrates an embodiment according to a second aspect of the invention. It is noted that features and components mentioned with respect to the second aspect may correspond to and/or have the same meaning as features and components as explained with respect to the first aspect. It is further noted that the first and second aspect may be combined. According to the second aspect, the object of the invention is achieved with an actuator assembly for moving a load, comprising a first piezo actuator 101 having a first terminal 102 and a second terminal 103, wherein the first piezo actuator 101 is configured to expand in a first direction when a voltage at the first terminal 102 is larger than a voltage at the second terminal 103. The actuator assembly further comprises a second piezo actuator 111 having a first terminal 112 and a second terminal 113, wherein the second piezo actuator 111 is configured to expand in a second direction when a voltage at the first terminal 112 is larger than a voltage at the second terminal 113. The actuator assembly further comprises a power unit 151 comprises a set point terminal 152 configured to receive a set point representative of a desired movement of the load. Said power unit 151 is configured to generate a power signal 201 for the first 101 and second piezo actuator 111 based on the set point. Preferably, the power unit 151 is configured to provide the power signal 201 to the first terminal 102 of the first piezo actuator 101 and to the second terminal 113 of the second piezo actuator 111.

In this embodiment, the power unit 151 outputs a single power signal 201 for controlling the first 101 and second piezo actuator 111, which in the shown example is split into the first power signal 201a and the second power signal 201b. As such, it is ensured that the first power signal 201a and the second power signal 201b are substantially identical. It is noted that optionally the first power correction 211 and/or the second power correction 212 may be superimposed to the first power signal 201a and the second power signal 201b, respectively. Optionally the power unit 151 comprises a single amplifier or amplifier circuit 157 for outputting the power signal 201, e.g. based on a control signal 221 outputted by an optional processing unit 156. The first power signal 201a is provided to the first terminal 102 of the first piezo actuator 101, which corresponds with the input terminal 102 mentioned with reference to the first aspect. The second power signal 201b is provided to the second terminal 113 of the second piezo actuator 111, which corresponds with the input terminal 113 mentioned with reference to the first aspect. When the first piezo actuator 101 expands, the second piezo actuator 111 will contract, and vice versa, by substantially the same distance. The resultant force to which the load is exposed is therefore reduced, such that vibrations and/or deformation of the load is limited. This arrangement may in particular be advantageous in the actuator assembly shown in FIG. 4a.

It is further noted that in some cases the hysteresis component 104, 114 of the first 101 and second piezo actuator 111 may be relatively substantial, resulting e.g. in the first piezo actuator 101 expanding by more than that the second piezo actuator 111 contracts. This may, among others, depend on the material used in the first 101 and second piezo actuator 111 and/or how much the first 101 and second piezo actuator 111 have already expanded or contracted. In such cases, it may in particular be advantageous to combine the second aspect with the first aspect, such that relative deviations causes by hysteresis components 104, 114 can be corrected using the correction unit 121.

In FIG. 6-8, it is further shown that optionally the feedback unit 155 may comprise an output terminal 155.1 for outputting the feedback value. The processing unit 156 may comprise an input terminal 156.1 for receiving the set point or a difference between set point and the feedback value. The processing unit 156 may comprise an output terminal 156.2 for outputting the control signal 221, which is received by the amplifier circuit 157 via an input terminal 157.1. When applicable (see FIG. 8), the processing unit 156 may comprises an input terminal 156.3 for receiving the first 201 and/or second power correction 211, and an output terminal 156.4 for outputting the second control signal 221b to input terminal 157.1' of the further amplifier circuit 157'. The first control signal 221a is outputted via output terminal 156.2.

In FIG. 6-8, it is further shown that the correction unit 121 optionally comprises differential unit 124 for determining the output voltage difference, which is outputted via output terminal 124.1. The correction unit 121 optionally comprises an input terminal 127 for receiving a correction input. The correction input may e.g. be a determined value from another measurement, e.g. a measurement of stress or deformation of the load, or it may e.g. represent a desired difference in expansion and/or contraction between the first 101 and second piezo actuator 111. The processing unit 125 comprises an input terminal 125.1 for receiving the output voltage difference and optionally the correction input, although it is also possible to provide an additional input terminal for the correction input. Via output terminal 125.2 a control signal can be outputted to an input terminal 126a.1 of amplifier circuit 126a for generating the first power correction 211, which is outputted via output terminal 128. Via output terminal 125.3 a control signal can be outputted to an input terminal 126b.1 of amplifier circuit 126b for generating the second power correction 212, which is outputted via output terminal 129.

It is noted that the components shown as part of the power unit 151 and the correction unit 121 can be embodied in numerous ways. For example, any determination or calculation can be done using electrical hardware components or digitally using software. Components may be combined within the power unit 151 itself, the correction unit 121 itself, or even between the power unit 151 and the correction unit 121, thereby also reducing the number of input terminals and output terminals.

Figure 4A:
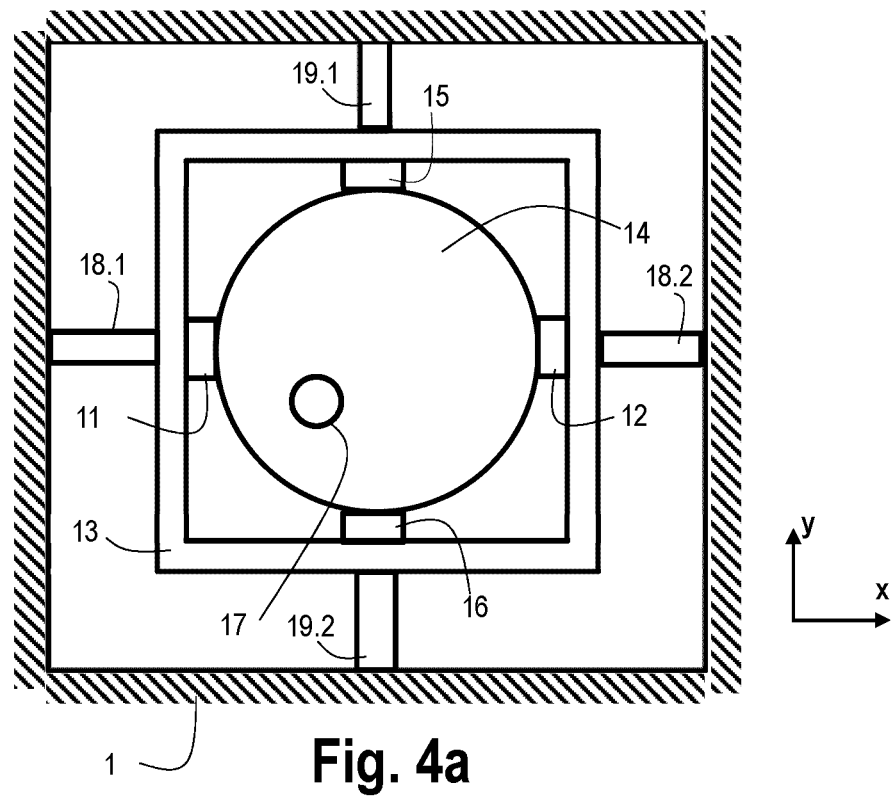
FIG. 4a and FIG. 4b schematically illustrate an application of an actuator assembly comprising a piezo actuator.
Figure 4B:
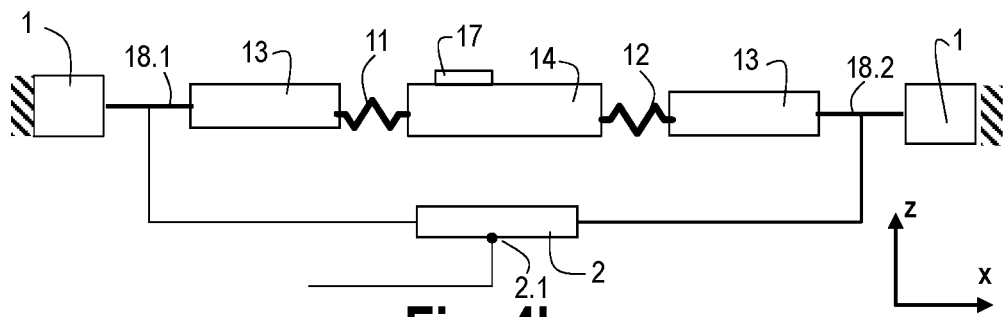

With reference to FIG. 4a, several further advantageous embodiments will be explained which may be applied to the actuator assembly according to the first aspect and/or the second aspect. That is, the actuator assembly shown in FIG. 4a may be in correspondence with the first aspect and/or the second aspect, wherein the first piezo actuator 11 corresponds with the first piezo actuator 101, the second piezo actuator 12 corresponds with the second piezo actuator 111, and both the first direction and the second direction correspond with direction x.

As can be seen, in an embodiment the first direction x and the second direction x are substantially parallel, and optionally coinciding. So, the first 11 and second piezo actuator 12 expand and/or contract in substantially parallel direction and cooperate to exert a force on the load 14 in said direction.

In an embodiment the first piezo actuator 11 and the second piezo actuator 12 are configured to move the load 14 in the first direction x and/or in the second direction x. So, the load 14 is moved in the same direction x as the first 11 and/or second piezo actuator 12 expands or contracts. Advantageously, the invention allows to control the first 11 and second piezo actuator 12 in correspondence with each other to improve the movement of the load 14, e.g. decreasing vibrations and deformation. It is noted that in some embodiments the first 11 and second piezo actuator 12 may engage the load 14 directly, while in other embodiments force transmission components may be arranged between the first 11 and/or second piezo actuator 12 and the load 14.

In a further embodiment, the actuator assembly further comprises a third piezo actuator 15 configured to move the load 14 in a perpendicular direction y, said perpendicular direction y being perpendicular to the first direction x and the second direction x. The third piezo actuator 15 has a clamped mode configured to clamp the load 14, and a released mode configured to allow the load 14 to move relative to the third actuator 15 in the first and second direction x. For example, the third piezo actuator 15 may engage the load 14 directly or indirectly when in the clamped mode, and may be contracted to be moved to the released mode wherein the load 14 is no longer engaged.

In the shown embodiment the first and second direction x are substantially parallel in a substantially horizontal plane xy, and the third direction y is also in the substantially horizontal plane xy. In an alternative embodiment the first and second direction x are in a substantially horizontal plane xy and the third direction is in a substantially vertical plane, wherein optionally the first and second direction are also perpendicular to each other.

Optionally, e.g. when the first and second direction x are parallel, the actuator assembly further comprises a fourth piezo actuator 16 configured to move the load 14 in a second perpendicular direction y, said second perpendicular direction y being perpendicular to the first direction x and the second direction x. In the shown example said second perpendicular direction y is parallel or coinciding with the perpendicular direction y, but alternatively the second perpendicular direction may also be perpendicular to the perpendicular direction y. For example, the first direction x, second direction x, and perpendicular direction y may be arranged in a substantially horizontal plane, and the second perpendicular direction may be arranged in a substantially vertical direction.

In an embodiment wherein the actuator assembly comprises the third 15 and fourth piezo actuator 16 to move the load 14 the same perpendicular direction y, the third 15 and fourth piezo actuator 16 may be embodied according to one or more of the embodiments of the first and/or second aspect. That is, the third piezo actuator 15 may correspond with a first piezo actuator as referred to with respect to the first and/or second aspect, and the fourth piezo actuator 16 may correspond with a second piezo actuator as referred to with respect to the first and/or second aspect.

With reference to FIG. 5, several advantageous embodiments will be explained which may be applied to the actuator assembly according to the first aspect and/or the second aspect. So, the actuator assembly shown in FIG. 5 may be in correspondence with the first aspect and/or the second aspect, wherein the first piezo actuator 21 corresponds with the first piezo actuator 101, the second piezo actuator 22 corresponds with the second piezo actuator 111, and both the first direction and the second direction correspond with direction x.

As can be seen, in an embodiment the first direction x and the second direction x are substantially parallel, and in this example even coinciding. So, the first 21 and second piezo actuator 22 expand and/or contract in substantially parallel direction x.

In an embodiment, the first piezo actuator 21 and the second piezo actuator 22 each have a clamped mode configured to clamp the load 26, and a released mode configured to allow the load 26 to move relative to the first 21 or second piezo actuator 22, respectively. In FIG. 5, the first 21 and second piezo actuator 22 are shown in the clamped mode in stages I-III and VI, and in the released mode in stages IV and V. The first piezo actuator 21 is configured to be arranged from the clamped mode into the released mode by expanding or contracting in the first direction x, and the second piezo actuator 22 is configured to be arranged from the clamped mode into the released mode by expanding or contracting in the second direction x. Advantageously the invention allows to control the first 21 and second piezo actuator 22 in correspondence with each other, such that they are arranged in their respective clamped modes substantially simultaneously, and/or clamp the load 26 with substantially the same force. As such, vibration and deformation of the load can be reduced, e.g. when moving from the clamped mode to the released mode and vice versa.

In a further embodiment the actuator assembly further comprises a first perpendicular actuator 23 configured to move the load 26 in a third direction y substantially perpendicular to the first direction x. The first piezo actuator 21 is configured to arrange the first perpendicular actuator 23 such that the first perpendicular actuator 23 is able to move the load 26, when the first piezo actuator 21 is in the clamped mode. The actuator assembly further comprises a second perpendicular actuator 24 configured to move the load 26 in a fourth direction y substantially perpendicular to the second direction x. The second piezo actuator 22 is configured to arrange the second perpendicular actuator 24 such that the second perpendicular actuator 24 is able to move the load 26, when the second piezo actuator 22 is in the clamped mode.

In the shown example, by expanding the first 21 and second piezo actuator 22 so that they are in the clamped mode, the first 23 and second perpendicular actuator 24 engage the load 26. As such they can move the load 26 in the third and fourth direction y, which coincide in the shown example.

In a further embodiment, the first perpendicular actuator 23 is a third piezo actuator 23 and the second perpendicular actuator 24 is a fourth piezo actuator 24. In particular, the third 23 and fourth piezo actuator 24 may be shear piezo actuators, configured to exert a shear force on the load 26 when they expand, such that the load 26 is moved in the third and fourth direction y.

In an embodiment wherein the actuator assembly comprises the third 23 and fourth piezo actuator 24 to move the load 26 in the same third and fourth direction y, the third 23 and fourth piezo actuator 24 may be embodied according to one or more of the embodiments of the first and/or second aspect. That is, the third piezo actuator 23 may correspond with a first piezo actuator as referred to with respect to the first and/or second aspect, and the fourth piezo actuator 24 may correspond with a second piezo actuator as referred to with respect to the first and/or second aspect. It is also possible that the third 23 and fourth piezo actuator 24 are embodied according to one or more of the embodiments of the first and/or second aspect while the first 21 and second piezo actuator 22 are not.

In the example shown in FIG. 5, the first 21, second 22, third 23 and fourth piezo actuator 24 form a first set 31. A second set 32 also comprises four piezo actuators which function in the same way as the first set 31. The first 31 and second set 32 cooperate such that while e.g. the first set 31 has its first 21 and second piezo actuator 22 in the released state, the second set 32 moves the load 26. The load 26 is effectively moved in steps, which are illustrated by stage I-VI in FIG. 5. Using the invention, it can be achieved that the transition from one step to the next step is performed smoother, such that vibrations of the load 26 are reduced.

In an embodiment, the actuator assembly comprise multiple sets 31, 32 of piezo actuators, e.g. two, three or four sets, preferably each comprising a first 21, second 22, third 23 and fourth piezo actuator 24. Optionally the actuator assembly comprise four sets 31, 32, wherein the first 21 and second piezo actuators 22 of the first 31 and third set are controlled with a same power signal, preferably in correspondence with the first aspect. Optionally also the first and second piezo actuators of the second 32 and fourth set are controlled with a same power signal, preferably in correspondence with the first aspect. Optionally the actuator assembly comprise four sets 31, 32, wherein the third 23 and fourth piezo actuators 24 of the first 31 and third set are controlled with a same power signal, preferably in correspondence with the first aspect. Optionally also the third and fourth piezo actuators of the second 32 and fourth set are controlled with a same power signal, preferably in correspondence with the first aspect.

Referring now back to FIG. 4a, wherein the load 14 may be an object holder 14. The invention further relates to a stage apparatus comprising an object holder 14 configured to hold an object 17, and an actuator assembly according to the first aspect and/or the second aspect, configured to move the object holder 14. For example, the stage apparatus may be used in a lithographic process, wherein the object 17 to be arranged on the object holder 14 is a substrate, e.g. a wafer. During the process, e.g. during exposure, the object 17 needs to be moved relative to the frame 13. The actuator assembly may then be used to move the object holder 14 and as such, the object 17 arranged on it. Applying one or more aspects of the invention, vibration and/or deformation of the object holder 14 may be reduced, thereby allowing to position the object 17 with more accuracy. Consequently, the lithographic process may be performed with higher accuracy, e.g. by projecting the pattern onto the object 17 more accurately.

With reference to both FIG. 4a and FIG. 6, the second aspect may also be summarized as follows. In accordance with the second aspect, the invention relates to a stage apparatus comprising an object holder 14 configured to hold an object 17, and an actuator assembly configured to move the object holder 14 in a first direction x and/or a second direction x. The actuator assembly comprises a first piezo actuator 11, 101 having a first terminal 102 and a second terminal 103, wherein the first piezo actuator 11, 101 is configured to expand in the first direction x when a voltage at the first terminal 102 is larger than a voltage at the second terminal 103. The actuator assembly further comprises a second piezo actuator 12, 111 having a first terminal 112 and a second terminal 113, wherein the second piezo actuator 12, 111 is configured to expand in the second direction x when a voltage at the first terminal 112 is larger than a voltage at the second terminal 113. The actuator assembly further comprises a power unit 151 configured to output a power signal 201 based on a control signal 221, wherein the power unit 151 is configured to provide the power signal 201 to the first terminal 102 of the first piezo actuator 11, 101 and to the second terminal 113 of the second piezo actuator 12, 111.

With reference to FIG. 4a-4b, a third aspect of the invention will now be explained. It is noted that features and components mentioned with respect to the third aspect may correspond to and/or have the same meaning as features and components as explained with respect to the first and/or second aspect. It is further noted that the first and/or second aspect may be combined with the third aspect. According to the third aspect, the invention relates to a stage apparatus comprising an object holder 14 configured to hold an object 17, and a positioner comprising a first positioning module and a second positioning module. The first positioning module comprises at least a first piezo actuator 11 configured to position the object holder 14, and the second positioning module is configured to position the object holder 14 and the first positioning module based on an object holder set point representing a desired movement of the object holder 14 during positioning with the second positioning module. The stage apparatus further comprises a processing unit 2 configured to determine a corrected object holder set point based on relative displacement between the second positioning module and the object holder 14 caused by a deformation of the first positioning module during positioning with the second positioning module.

For example, the first positioning module may correspond with the long-stroke module and the second positioning module with the short-stroke module of the first positioner PM or the second positioner PW shown in FIG. 1-3.

In the example shown in FIG. 4a-4b, the first positioning module comprises a first set of first module actuators 18.1, 18.2 for positioning in the x-direction, and a second set of first module actuators 19.1, 19.2 for positioning in the y-direction. The first module actuators 18.1, 18.2, 19.1, 19.2 can be any suitable actuator, e.g. a voice-coil actuator, a reluctance actuator, a Lorentz-actuator or a piezo-actuator. Optionally the first set of first module actuators 18.1, 18.2 and/or the second set of first module actuators 19.1, 19.2 are piezo actuators embodied according to the first and/or second aspect, i.e. being part of an actuator assembly according to the first and/or second aspect.

In the shown example, the second positioning module comprises the first piezo actuator 11, the second piezo actuator 12, the third piezo actuator 15, and the fourth piezo actuator 16.

The first positioning module may e.g. be used to position the second positioning module and the object holder 14 over a relatively large distance, while the second positioning module may be used to position the object holder 14 over a relatively small distance with relatively high accuracy. For example, if the stage apparatus is used in a lithographic apparatus, the second positioning module may be used to position the object holder 14 and the object 17 arranged thereon during exposure.

In accordance with the third aspect, the object holder set point represents a desired movement of the object holder 14 during positioning with the second positioning module. In the shown example (see FIG. 4b), the processing unit 2 comprises a set point terminal 2.1 for receiving the object holder set point. If, for example, the object holder set point dictates that the object holder 14 should move in the x-direction, the first set of first module actuators 18.1, 18.2 may exert a force. In the shown example, said force may be exerted on the frame 13, and movement of the frame 13 will cause the object holder 14 to move via the first 11 and second piezo actuators 12. However, in practice the first 11 and second piezo actuator 12 may deform and allow relative displacement between the frame 13 and the object holder 14, with a degree depending on the stiffness, which in turn may be dependent on a power signal provided to the respective first 11 or second piezo actuator 12. In accordance with the third aspect, the processing unit 2 is therefore configured to determine the corrected object holder set point.

In an embodiment, the corrected object holder set point represents a correction for the object holder set point, wherein the second positioner is configured to position the object holder 14 and the first positioning module based on the corrected object holder set point. So, the corrected object holder set point is determined, and the second positioner is controlled based on said corrected object holder set point. As such, relative displacement between the frame 13 and the object holder 14 is compensated for.

For example, the corrected object holder set point can be determined using the following formula:

$$r_{corrsp} = r_{sp} + \frac{m * a_{oh}}{k}. \tag{1}$$

In formula (1), $r_{corr\_sp}$ represents the corrected object holder set point, in particular a corrected position of the object holder 14, $r_{sp}$ represents the object holder set point, in particular a desired position of the object holder 14, m represents the mass to be moved by the first positioning module, i.e. including the object holder 14 and the object 17 arranged on it, $a_{oh}$ represents the set point acceleration of object holder 14, and k represents the stiffness of the first positioning module. Said stiffness k is caused by the at least one piezo actuator 11, and may among others be dependent on a power signal provided to said piezo actuator 11. In the shown example wherein the object holder 14 is moved in the x-direction, the stiffness k is a combination of the first 11 and second piezo actuator 12.

In an embodiment, the corrected object holder set point represents a correction for the movement of the object holder 14 during positioning with the second positioning module. In practice, the movement of the object holder 14, in particular the position of the object holder 14, is used in further steps of the process, as the position of the object 17 is determined by the position at which the object holder 14 is. Therefore, the movement of the object holder 14 may be corrected using the corrected object holder set point, such that the relative displacement between the frame 13 and the object holder 14 is taken into account.

For example, the corrected object holder set point can be determined using the following formula:

$$r_{objhold} = r_{sp} - \frac{m * a_{oh}}{k}. \quad (2)$$

In formula (2), $r_{obj\_hold}$ represents the corrected object holder set point.

In an embodiment, the corrected object holder set point is based on at least a stiffness of at least the first piezo actuator 101. This may e.g. be done using formula (1) or formula (2) above.

In an embodiment according to one or more of the first, second and third aspect, additional piezo actuators may be provided and controlled according to the invention. For example, three, four, five, six, seven or eight piezo actuator in total. For example, in accordance with the first aspect, the power signal may be outputted to one or more further piezo actuators, wherein the correction unit is preferably configured to determine one or more further power corrections for said further piezo actuators.

In an embodiment according to one or more of the first, second and third aspect, one or more parallel piezo actuators may be provided, being controlled in parallel with the first and/or second piezo actuator, such that e.g. the first piezo actuator and a parallel piezo actuator exert a force on the load as a group of parallel piezo actuators.

In practice, it may be preferred that the first and the second piezo actuator have an identical behaviour of expansion/contraction in function of the supplied power signal. Similarly it may be preferred that the first 182 and second reference capacitor 183 shown in FIG. 6-8 are identical to each other. However, in practice this may not be the case, e.g. because of manufacturing tolerances. Any deviation from the preferred situation may therefore be determined beforehand, e.g. during a calibration. From this one or more calibration values may be determined. Preferably, the correction unit 121 is configured to determine the first 201 and/or second power correction 211 based on the calibration values.

The invention further relates to an apparatus comprising an actuator assembly according to the invention and/or a stage apparatus according to the invention. The apparatus may e.g. be a lithographic apparatus, a metrology apparatus, a particle beam apparatus, an electron beam apparatus, an electron beam inspection apparatus, or an inspection apparatus. For example, the apparatus may be a lithographic apparatus as shown in FIG. 1-3.

The invention further relates to a projection system for use in a lithographic apparatus or an inspection apparatus, comprising one or more optical elements, and an actuator assembly according to the invention, configured to move at least one of the one or more optical elements. For example, the actuator assembly may be according to one or more of the embodiments explained with reference to FIG. 5.

The invention further relates to a device manufacturing method comprising transferring a pattern from a patterning device onto a substrate, comprising the step of using a lithographic apparatus comprising: an actuator assembly according to the invention; and/or a stage apparatus according to the invention; and/or a projection system according to the invention.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Embodiments are provided according to the following clauses:

1. Actuator assembly for moving a load, comprising:
   a first piezo or electrostrictive actuator having an input terminal configured to receive a first power signal and an output terminal, wherein the first piezo or electrostrictive actuator is configured to expand or contract in a first direction when a voltage difference is present between the input terminal and the output terminal, a second piezo or electrostrictive actuator having an input terminal configured to receive a second power signal and an output terminal, wherein the second piezo or electrostrictive actuator is configured to expand or contract in a second direction when a voltage difference is present between the input terminal and the output terminal, and a correction unit, the correction unit:
  comprising a first input terminal connected to the output terminal of the first piezo or electrostrictive actuator, and a second input terminal connected to the output terminal of the second piezo or electrostrictive actuator, and
  configured to determine:
    an output voltage difference representing a difference between a voltage at the output terminal of the first piezo or electrostrictive actuator and a voltage at the output terminal of the second piezo or electrostrictive actuator, and
    a first power correction for correcting the first power signal and/or a second power correction for correcting the second power signal, based on the output voltage difference.

2. Actuator assembly according to clause 1, further comprising a power unit, the power unit:
  comprising a set point terminal configured to receive a set point representative of a desired movement of the load,
  configured to generate a first power signal for the first piezo or electrostrictive actuator and second power signal for the second piezo or electrostrictive actuator based on the set point, and
  configured to output the first power signal and the second power signal,
  wherein the power unit is configured to output the first power signal and the second power signal as identical signals, and
  wherein the correction unit is configured to adjust the first power signal based on the first power correction and/or to adjust the second power signal based on the second power correction.

3. Actuator assembly according to clause 1, further comprising a power unit, the power unit comprising a set point terminal configured to receive a set point representative of a desired movement of the load, a correction terminal configured to receive the first power correction and/or the second power correction from the correction unit, and configured to:
  generate the first power signal for the first piezo or electrostrictive actuator based on the set point and the first power correction, and the second power signal for the second piezo or electrostrictive actuator based on the set point and the second power correction,
  output the first power signal and the second power signal.

4. Actuator assembly according to one or more of the preceding clauses, further comprising a feedback unit, the feedback unit comprising a first input terminal connected to the output terminal of the first piezo or electrostrictive actuator, and a second input terminal connected to the output terminal of the second piezo or electrostrictive actuator, and configured to:
  determine a common output voltage representing a correspondence between the voltage at the output terminal of the first piezo or electrostrictive actuator and the voltage at the output terminal of the second piezo or electrostrictive actuator,
  determine a feedback value representative of a movement of the load, based on the common output voltage.

5. Actuator assembly for moving a load, comprising:
  a first piezo or electrostrictive actuator having a first terminal and a second terminal, wherein the first piezo or electrostrictive actuator is configured to expand in a first direction when a voltage at the first terminal is larger than a voltage at the second terminal,
  a second piezo or electrostrictive actuator having a first terminal and a second terminal, wherein the second piezo or electrostrictive actuator is configured to expand in a second direction when a voltage at the first terminal is larger than a voltage at the second terminal,
  a power unit, the power unit comprising a set point terminal configured to receive a set point representative of a desired movement of the load, and configured to:
    generate a power signal for the first and second piezo or electrostrictive actuator based on the set point,
    provide the power signal to the first terminal of the first piezo or electrostrictive actuator and to the second terminal of the second piezo or electrostrictive actuator.

6. Actuator assembly according to one or more of the preceding clauses, wherein the first direction and the second direction are substantially parallel, and optionally coinciding.

7. Actuator assembly according to one or more of the preceding clauses, wherein the first piezo or electrostrictive actuator and the second piezo or electrostrictive actuator are configured to move the load in the first direction and/or in the second direction.

8. Actuator assembly according to clause 7, further comprising a third piezo or electrostrictive actuator configured to move the load in a perpendicular direction, said perpendicular direction being perpendicular to the first direction and the second direction, wherein the third piezo or electrostrictive actuator has a clamped mode configured to clamp the load, and a released mode configured to allow the load to move relative to the third actuator in the first and second direction.

9. Actuator assembly according to one or more of the preceding clauses, wherein the first piezo or electrostrictive actuator and the second piezo or electrostrictive actuator each have:
  a clamped mode configured to clamp the load, and
  a released mode configured to allow the load to move relative to the first or second piezo or electrostrictive actuator, respectively,
  wherein the first piezo or electrostrictive actuator is configured to be arranged from the clamped mode into the released mode by expanding or contracting in the first direction, and the second piezo or electrostrictive actuator is configured to be arranged from the clamped mode into the released mode by expanding or contracting in the second direction.

10. Actuator assembly according to clause 9, further comprising:
  a first perpendicular actuator configured to move the load in a third direction substantially perpendicular to the first direction, wherein the first piezo or electrostrictive actuator is configured to arrange the first perpendicular actuator such that the first perpendicular actuator is able to move the load, when the first piezo or electrostrictive actuator is in the clamped mode, and
  a second perpendicular actuator configured to move the load in a fourth direction substantially perpendicular to the second direction, wherein the second piezo or electrostrictive actuator is configured to arrange the second perpendicular actuator such that the second perpendicular actuator is able to move the load, when the second piezo or electrostrictive actuator is in the clamped mode.

11. Actuator assembly according to clause 10, wherein the first perpendicular actuator is a third piezo or electrostrictive actuator and the second perpendicular actuator is a fourth piezo or electrostrictive actuator.

12. Stage apparatus, comprising:
an object holder configured to hold an object, and
then actuator assembly according to one or more of the preceding clauses configured to move the object holder.

13. Stage apparatus, comprising:
an object holder configured to hold an object,
a positioner comprising a first positioning module and a second positioning module, wherein
the first positioning module comprises at least a first piezo or electrostrictive actuator configured to position the object holder, and
the second positioning module is configured to position the object holder and the first positioning module based on an object holder set point representing a desired movement of the object holder during positioning with the second positioning module,
a processing unit configured to determine a corrected object holder set point based on relative displacement between the second positioning module and the object holder caused by a deformation of the first positioning module during positioning with the second positioning module.

14. Stage apparatus according to clause 13, wherein the corrected object holder set point represents a correction for the object holder set point, wherein the second positioner is configured to position the object holder and the first positioning module based on the corrected object holder set point.

15. Stage apparatus according to clause 13, wherein the corrected object holder set point represents a correction for the movement of the object holder during positioning with the second positioning module.

16. Stage apparatus according to one or more of clauses 13-15, wherein the corrected object holder set point is based on at least a stiffness of at least the first piezo or electrostrictive actuator.

17. Apparatus comprising an actuator assembly according to one or more of the clauses 1-11 and/or a stage apparatus according to one or more of the clauses 12-16, wherein the apparatus is a lithographic apparatus, a metrology apparatus, a particle beam apparatus, an electron beam apparatus, an electron beam inspection apparatus, or an inspection apparatus.

18. Projection system for use in a lithographic apparatus or an inspection apparatus, comprising:
one or more optical elements, and
an actuator assembly according to one or more of the clauses 1-11, configured to move at least one of the one or more optical elements.

19. A device manufacturing method comprising transferring a pattern from a patterning device onto a substrate, comprising the step of using a lithographic apparatus comprising:
an actuator assembly according to one or more of the clauses 1-1, and/or
a stage apparatus according to one or more of the clauses 12-16, and/or
a projection system according to clause 18.

The invention claimed is:

1. An actuator assembly for moving a load, the actuator assembly comprising:
a first piezo or electrostrictive actuator having an input terminal configured to receive a first power signal and an output terminal, wherein the first piezo or electrostrictive actuator is configured to expand or contract in a first direction when a voltage difference is present between the input terminal and the output terminal,
a second piezo or electrostrictive actuator having an input terminal configured to receive a second power signal and an output terminal, wherein the second piezo or electrostrictive actuator is configured to expand or contract in a second direction when a voltage difference is present between the input terminal of the second piezo or electrostrictive actuator and the output terminal of the second piezo or electrostrictive actuator, wherein the first and second piezo or electrostrictive actuators are not in series electrical connection, and
a correction unit, the correction unit:
comprising a first input terminal connected to the output terminal of the first piezo or electrostrictive actuator, and a second input terminal connected to the output terminal of the second piezo or electrostrictive actuator, and
configured to determine:
an output voltage difference representing a difference between a voltage at the output terminal of the first piezo or electrostrictive actuator and a voltage at the output terminal of the second piezo or electrostrictive actuator, and
a first power correction to correct the first power signal and/or a second power correction to correct the second power signal, based on the output voltage difference.

2. The actuator assembly according to claim 1, further comprising a power unit, the power unit:
comprising a set point terminal configured to receive a set point representative of a desired movement of the load,
configured to generate a first power signal for the first piezo or electrostrictive actuator and second power signal for the second piezo or electrostrictive actuator based on the set point,
configured to output the first power signal and the second power signal, and
configured to output the first power signal and the second power signal as identical signals, wherein the correction unit is configured to adjust the first power signal based on the first power correction and/or to adjust the second power signal based on the second power correction.

3. The actuator assembly according to claim 1, further comprising a power unit:
comprising a set point terminal configured to receive a set point representative of a desired movement of the load,
comprising a correction terminal configured to receive the first power correction and/or the second power correction from the correction unit,
configured to generate the first power signal for the first piezo or electrostrictive actuator based on the set point and the first power correction, and the second power signal for the second piezo or electrostrictive actuator based on the set point and the second power correction, and
configured to output the first power signal and the second power signal.

4. The actuator assembly according to claim 1, further comprising a feedback unit, the feedback unit:
comprising a first input terminal connected to the output terminal of the first piezo or electrostrictive actuator, and a second input terminal connected to the output terminal of the second piezo or electrostrictive actuator, and
configured to:
determine a common output voltage representing a correspondence between the voltage at the output terminal of the first piezo or electrostrictive actuator and the voltage at the output terminal of the second piezo or electrostrictive actuator,
determine a feedback value representative of a movement of the load, based on the common output voltage.

5. The actuator assembly according to claim 1, wherein the first direction and the second direction are substantially parallel.

6. The actuator assembly according to claim 1, wherein the first piezo or electrostrictive actuator and the second piezo or electrostrictive actuator are configured to move the load in the first direction and/or in the second direction.

7. The actuator assembly according to claim 6, further comprising a third piezo or electrostrictive actuator configured to move the load in a perpendicular direction, the perpendicular direction being perpendicular to the first direction and the second direction, wherein the third piezo or electrostrictive actuator has a clamped mode configured to clamp the load, and a released mode configured to allow the load to move relative to the third piezo or electrostrictive actuator in the first and second direction.

8. The actuator assembly according to claim 1, wherein the first piezo or electrostrictive actuator and the second piezo or electrostrictive actuator each have:
a clamped mode configured to clamp the load, and
a released mode configured to allow the load to move relative to the first or second piezo or electrostrictive actuator, respectively,
wherein the first piezo or electrostrictive actuator is configured to be arranged from the clamped mode into the released mode by expanding or contracting in the first direction, and the second piezo or electrostrictive actuator is configured to be arranged from the clamped mode into the released mode by expanding or contracting in the second direction.

9. The actuator assembly according to claim 8, further comprising:
a first perpendicular actuator configured to move the load in a third direction substantially perpendicular to the first direction, wherein the first piezo or electrostrictive actuator is configured to arrange the first perpendicular actuator such that the first perpendicular actuator is able to move the load, when the first piezo or electrostrictive actuator is in the clamped mode, and
a second perpendicular actuator configured to move the load in a fourth direction substantially perpendicular to the second direction, wherein the second piezo or electrostrictive actuator is configured to arrange the second perpendicular actuator such that the second perpendicular actuator is able to move the load, when the second piezo or electrostrictive actuator is in the clamped mode.

10. The actuator assembly according to claim 9, wherein the first perpendicular actuator is a third piezo or electrostrictive actuator and the second perpendicular actuator is a fourth piezo or electrostrictive actuator.

11. A stage apparatus, comprising:
an object holder configured to hold an object,
the actuator assembly according to claim 1 configured to move the object holder.

12. An apparatus comprising the actuator assembly according to claim 1, wherein the apparatus is a lithographic apparatus, a metrology apparatus, a particle beam apparatus, an electron beam apparatus, an electron beam inspection apparatus, or an inspection apparatus.

13. A projection system for use in a lithographic apparatus or an inspection apparatus, the projection system comprising:
one or more optical elements, and
the actuator assembly according to claim 1, configured to move at least one of the one or more optical elements.

14. A device manufacturing method comprising transferring a pattern from a patterning device onto a substrate using a lithographic apparatus comprising the actuator assembly according to claim 1.

15. An actuator assembly for moving a load, the actuator assembly comprising:
a first piezo or electrostrictive actuator having a first terminal and a second terminal, wherein the first piezo or electrostrictive actuator is configured to expand or contract in a first direction when a voltage difference is present between the first terminal and the second terminal,
a second piezo or electrostrictive actuator having a first terminal and a second terminal, wherein the second piezo or electrostrictive actuator is configured to expand or contract in a second direction when a voltage difference is present between the first terminal of the second piezo or electrostrictive actuator and the second terminal of the second piezo or electrostrictive actuator, wherein the first and second piezo or electrostrictive actuators are not in series electrical connection, and
a power unit, the power unit comprising a set point terminal configured to receive a set point representative of a desired movement of the load, and configured to:
generate a power signal for the first and second piezo or electrostrictive actuators based on the set point,
determine a corrected power signal based on the power signal and on an output voltage difference representing a difference between a voltage at the second terminal of the first piezo or electrostrictive actuator and a voltage at the second terminal of the second piezo or electrostrictive actuator, and
provide the corrected power signal to the first terminal of the first piezo or electrostrictive actuator and/or to the first terminal of the second piezo or electrostrictive actuator, to cause the first piezo or electrostrictive actuator to expand and the second piezo or electrostrictive actuator to contract together, or vice versa.

16. A stage apparatus, comprising:
an object holder configured to hold an object,
the actuator assembly according to claim 15 configured to move the object holder.

17. An apparatus comprising the actuator assembly according to claim 15, wherein the apparatus is a lithographic apparatus, a metrology apparatus, a particle beam apparatus, an electron beam apparatus, an electron beam inspection apparatus, or an inspection apparatus.

18. A projection system for use in a lithographic apparatus or an inspection apparatus, the projection system comprising:
one or more optical elements, and
the actuator assembly according to claim 15, configured to move at least one of the one or more optical elements.

19. A device manufacturing method comprising transferring a pattern from a patterning device onto a substrate using a lithographic apparatus comprising the actuator assembly according to claim 15.

20. The actuator assembly according to claim 15, wherein the first direction and the second direction are substantially parallel.

* * * * *